(12) United States Patent
Hosokawa

(10) Patent No.: US 8,873,247 B2
(45) Date of Patent: Oct. 28, 2014

(54) DEVICE AND MANUFACTURING METHOD OF THE SAME

(75) Inventor: Koji Hosokawa, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 454 days.

(21) Appl. No.: 13/181,040

(22) Filed: Jul. 12, 2011

(65) Prior Publication Data

US 2012/0020041 A1   Jan. 26, 2012

(30) Foreign Application Priority Data

Jul. 22, 2010   (JP) ................. 2010-165000

(51) Int. Cl.
| | |
|---|---|
| *H05K 7/00* | (2006.01) |
| *H01L 21/56* | (2006.01) |
| *H01L 23/31* | (2006.01) |
| *H01L 23/00* | (2006.01) |
| *H05K 3/28* | (2006.01) |
| *H05K 3/00* | (2006.01) |

(52) U.S. Cl.
CPC ..... *H01L 21/565* (2013.01); *H01L 2224/73265* (2013.01); *H01L 24/48* (2013.01); *H01L 2224/97* (2013.01); *H01L 2224/48227* (2013.01); *H01L 2924/01029* (2013.01); *H05K 3/284* (2013.01); *H01L 2924/014* (2013.01); *H01L 2224/48091* (2013.01); *H05K 3/0097* (2013.01); *H01L 24/97* (2013.01); *H01L 21/561* (2013.01); *H01L 23/3128* (2013.01); *H01L 2924/01033* (2013.01); *H01L 2224/32225* (2013.01); *H01L 2924/19105* (2013.01); *H01L 2924/15311* (2013.01); *H05K 3/0052* (2013.01); *H01L 2924/01005* (2013.01); *H01L 2924/01079* (2013.01); *H05K 2203/1327* (2013.01); *H01L 2224/48228* (2013.01); *H01L 2924/01006* (2013.01)
USPC ........... 361/779; 361/760; 361/790; 361/770; 174/260; 174/256; 257/737; 257/738

(58) Field of Classification Search
USPC .......................... 361/790, 770–774, 760, 779
See application file for complete search history.

(56) References Cited

U.S. PATENT DOCUMENTS

| | | | | | |
|---|---|---|---|---|---|
| 3,303,393 | A | * | 2/1967 | Hymes et al. | 361/779 |
| 5,764,486 | A | * | 6/1998 | Pendse | 361/774 |
| 6,492,737 | B1 | * | 12/2002 | Imasu et al. | 257/778 |
| 6,610,934 | B2 | | 8/2003 | Yamaguchi et al. | |
| 6,791,178 | B2 | | 9/2004 | Yamaguchi et al. | |
| 2004/0125579 | A1 | * | 7/2004 | Konishi et al. | 361/783 |
| 2004/0166608 | A1 | * | 8/2004 | Nakamura | 438/118 |
| 2004/0262033 | A1 | * | 12/2004 | Chiu et al. | 174/256 |
| 2005/0006442 | A1 | * | 1/2005 | Stillabower | 228/180.22 |
| 2005/0051358 | A1 | * | 3/2005 | Kawamoto et al. | 174/260 |
| 2005/0167815 | A1 | * | 8/2005 | Chang et al. | 257/692 |
| 2005/0253231 | A1 | * | 11/2005 | Liu | 257/678 |
| 2006/0014055 | A1 | * | 1/2006 | Reisdorf et al. | 429/12 |
| 2010/0314745 | A1 | * | 12/2010 | Masumoto et al. | 257/692 |

FOREIGN PATENT DOCUMENTS

| | | |
|---|---|---|
| JP | 62-144393 | 6/1987 |
| JP | 2000-332394 | 11/2000 |
| JP | 2001-044229 | 2/2001 |
| JP | 2001-044324 | 2/2001 |
| JP | 2002-359341 | 12/2002 |
| JP | 2004-6705 | 1/2004 |
| JP | 2005-347476 | 12/2005 |

* cited by examiner

*Primary Examiner* — Tuan T Dinh
*Assistant Examiner* — Steven T Sawyer
(74) *Attorney, Agent, or Firm* — Young & Thompson

(57) ABSTRACT

A device includes a wiring board, an element mounted on the wiring board, a spacer member intervening between the wiring board and the element to form a space therebetween, and an encapsulation body filling the space and encapsulating the element on the wiring board.

17 Claims, 8 Drawing Sheets

DEVICE AND MANUFACTURING METHOD OF THE SAME

This application is based upon and claims the benefit of priority from Japanese patent application No. 2010-165000, filed on Jul. 22, 2010, the disclosure of which is incorporated herein in its entirety by reference.

BACKGROUND OF THE INVENTION

This invention relates to a semiconductor device and a manufacturing method of the same.

The semiconductor device has an encapsulating body which covers a semiconductor chip mounted on a wiring board in order to protect the semiconductor chip.

There is a method called a mold array process (MAP) method as one of methods for encapsulating a semiconductor chip with encapsulation resin. According to the MAP method, encapsulation is executed collectively for a plurality of product formation areas arranged on a mother wiring board. After that, the mother wiring board is diced or cut into individual products along with an encapsulation body. Such a technique is disclosed in, for example, Japanese Laid Open Patent Publication No. 2001-044324 or No. 2001-044229.

SUMMARY

In recent years, requirements to materialize SIP (System In Package) of semiconductor devices are increasing as size and thickness of electronic equipment is reduced. To meet such requirements, studies have been carried out for a semiconductor device including both of a semiconductor chip and a passive element in a package thereof. When the MAP method is employed to encapsulate a semiconductor device including both of a semiconductor chip and a passive element, the passive element is encapsulated with encapsulation body together with the semiconductor chip.

In the meantime, the passive element is coupled to a wiring line formed on a wiring board by solder. The solder is melted in a reflow process to couple the passive element to the wiring line. At this time, the passive element goes down toward the wiring board due to surface tension of the solder and weight of the passive element. As a result, a distance between the passive element and the wiring board becomes small, for example, to about 20 μm or less. Into such a small distance, it is hard for encapsulation resin to flow. Consequently, it is impossible to fill a space between the passive element and the wiring board with the encapsulation resin. Thus, voids are caused at the vicinity of the passive element in the encapsulation body. There is a possibility that these voids leads degradation of reliability of the semiconductor device.

This invention seeks to solve one or more of the above problems, or to improve upon those problems at least in part.

In one embodiment, a device includes a wiring board, an element mounted on the wiring board, a spacer member intervening between the wiring board and the electronic element to form a space therebetween, and an encapsulation body filling the space and encapsulating the electronic element on the wiring board.

In another embodiment, a semiconductor device includes: a wiring board including an upper surface and a plurality of connection pads formed on the upper surface; a passive element mounted over the upper surface of the wiring board via a spacer member to form a space between the wiring board and the passive element, and that is electrically connected to at least an associated one of the connection pads; a semiconductor chip mounted over the upper surface of the wiring board, that is electrically connected to the associated one of the connection pads; an encapsulating body formed on the upper surface of the wiring board to cover the passive element and the semiconductor chip, the space being filled with the encapsulating body.

In still another embodiment, a semiconductor device includes: a wiring board including an upper surface and a plurality of connection pads formed on the upper surface; a first pair of spacer members provided on the wiring board; a second pair of spacer members provided on the wiring board, the second pair of spacer members being substantially parallel to the first pair of spacer members; a first passive element bridged between the first pair of spacer members to form a first space between the wiring board and the first passive element, the first passive element being electrically connected to the connection pads of the wiring board; a second passive element bridged between the second pair of spacer members to form a second space between the wiring board and the second passive element, the second passive element being electrically connected to the connection pads of the wiring board, and being substantially parallel to the first passive element; and an encapsulating body formed on the wiring board to cover the first passive element, the second passive element, the first pair of spacer members and the second pair of spacer members, the first and second space being filled with the encapsulating body.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
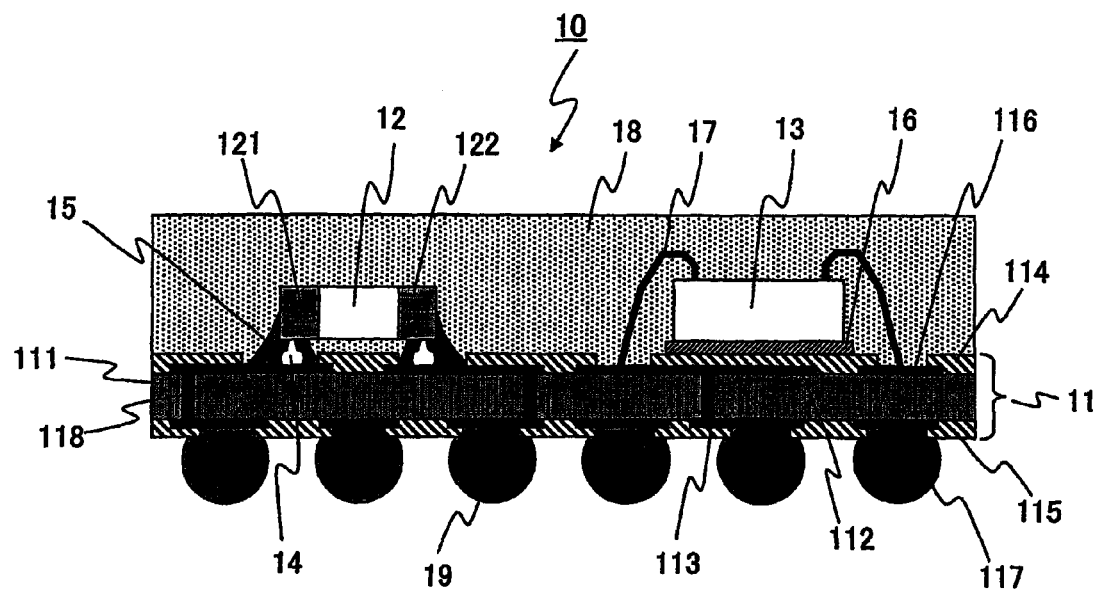
FIG. 1 is a longitudinal sectional view illustrating a schematic configuration of a semiconductor device according to a first embodiment of this invention.

FIG. 1 is a longitudinal sectional view illustrating a schematic configuration of a semiconductor device 10 according to a first embodiment of this invention.

In FIG. 1, the semiconductor device 10 includes a wiring board 11, a passive element(s) 12 and a semiconductor chip 13 which are mounted on a first (or upper) surface of the wiring board 11. The passive element 12 is supported by wire bumps 14, which are spacer members, and electrically coupled and physically fixed to the wiring board 11 with solder 15. The semiconductor chip 13 is fixed to the wiring board 11 with adhesive 16 and electrically coupled to the wiring board 11 with bonding wires 17. The passive element 12 and the semiconductor chip 13 are encapsulated by an encapsulating body 18 made of a resin on the first surface of the wiring board 11. On a second (or lower) surface of the wiring board 11, solder balls 19 are mounted as external terminals.

The wiring board 11 is a glassy epoxy substrate with a rectangular shape, for example. The wiring board 11 may have a core layer 111, wiring layers 112 and 113 provided on both sides of the core layer 111, and first protecting layers (or solder resists) 114 and 115 covering the first and the second surfaces of the wiring board 11. On a first (or upper) surface of the core layer 111, a plurality of connection pads 116 are provided to couple the passive elements 12 and the semiconductor chip 13 to wires of the wiring layer 112. On a second (or lower) surface of the core layer 111, a plurality of lands 117 are provided to couple the solder balls 16 mounted thereon to wires of the wiring layer 113. Through the core layer 111, vias 118 are provided to couple the wires of the wiring layer 112 on the first surface of the core layer 111 to the wires of the wring layer 113 on the second surface of the core layer 112.

The passive element 12 is a resistor, a capacitor, an inductor or the like. The passive element 12 has electrodes 121 and 122 at both ends thereof. The electrodes 121 and 122 are connected and fixed to the connection pads 116 of the wiring board 11 with the solder 15.

The wire bumps 14 are formed by means of a wire bonding machine (not shown), for example. The wire bumps 14 are provided on the connection pads 116, which are connected to the electrodes 121 and 122 of the passive element 12, and covered with the solder 15. A metal, such as Au or Cu, having a higher melting point than that of the solder 15 is used for material of the wire bumps 14 so that the wire bumps 14 do not melt in a reflow process for melting the solder 15. When the higher melting point metal is used for the material of the wire bumps 14, the wire bumps 14 do not melt even if the solder 15 melts. As a result, a distance between the passive element 12 and the wiring board 11 can be kept at the predetermined distance or more. That is, it is possible to keep a required height of a space between the passive element 12 and the wiring board 11 due to intervention of the wire bumps 14. A plurality of wire bumps 14 may be provided on each connection pad 116 to prevent the passive element 12 from tilting when the solder 15 melts. The predetermined distance is set so that molten resin used in the encapsulation process can flow easily into the space between the passive element 12 and the wiring board 11. Hence, the predetermined distance may vary according to the encapsulation process condition. Preferably, the predetermined distance, which is a distance between a surface of the first protect layer 114 and a surface of the passive element 12 facing to the first protect layer 114, is set to 20 μm or more.

The semiconductor chip 13 includes one or more semiconductor elements. The semiconductor chip 13 is fixed to the first surface of the wiring substrate 11 by means of the adhesive 16 in what is called faceup state. The adhesive 16 may be a die attach film (DAF) or insulation paste. The semiconductor chip 13 has electrode pads (not shown) that are electrically coupled to the connection pads 116 of the wiring substrate 11 by means of the bonding wires 17. As material of the bonding wires 17, Au or Cu is usable.

The encapsulation body 18 is made of insulation resin, e.g. epoxy resin. The encapsulation body 18 may be formed collectively by means of the MAP method for a plurality of products each of which is the semiconductor device 10. The encapsulation body 18 formed collectively is cut to divide the products into each one.

In the semiconductor device 10 according to the first embodiment, the wire bumps 14 keep the distance between the passive element 12 and the wiring board 11 higher than the predetermined distance. Accordingly, it is easy to remove residual of flux in a cleaning process after the reflow process for the solder 15. Moreover, it is easy to fill the encapsulation resin into the space between the passive element 12 and the wiring board 11 and it is possible to prevent or suppress occurrence of voids in the encapsulating process. Thus, reliability of the semiconductor device 10 is improved. In addition, because the passive element is protected by the encapsulation body 18, the reliability of the semiconductor device 10 is further improved. With this structure, in which the passive element is encapsulated together with the semiconductor chip, it is possible to implement a semiconductor device, such as a system in package (SIP), having a higher function.

Next, the description will be made about a manufacturing method of the semiconductor device 10 illustrated in FIG. 1.

Figure 2:
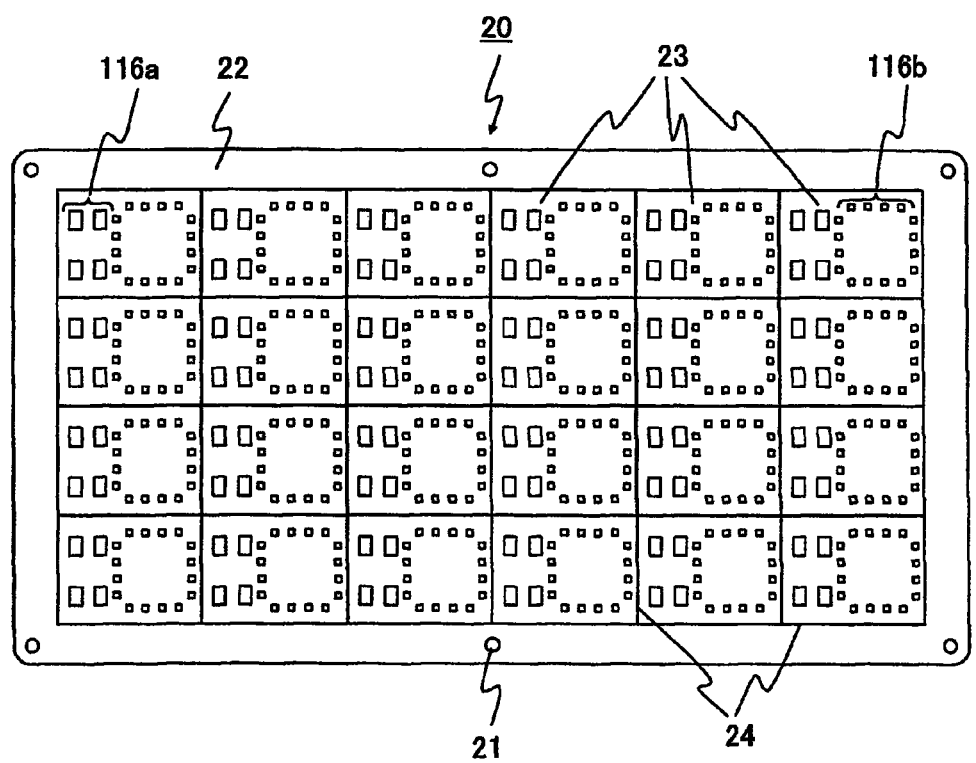
FIG. 2 is a plan view of a mother wiring board used for manufacturing the semiconductor device of FIG. 1.

FIG. 2 is a plan view which shows a schematic configuration of a mother wiring board 20 used for manufacturing the semiconductor device 10.

As illustrated in FIG. 2, the mother wiring board 20 includes a frame portion 22 through which positioning holes 21 are formed. The mother wiring board 20 further includes a plurality of product formation portions 23 arranged in matrix in an area surrounded by the frame portion 22. Each of the product formation portions 23 becomes the wiring board 11 when the mother wiring board 20 is diced along dicing lines 24.

In each of the product formation portions 23, wiring patterns (or wiring layers 112 and 113) are formed and their surfaces are covered with protect layers 114 and 115 (see FIG. 1). The protect layers 114 and 115 are partly removed to form openings at predetermined areas. Through the openings, a plurality of connection pads 116 and a plurality of lands 117 are exposed outside. The connection pads 116 include first pads 116a to be connected with the passive elements 12 and second pads 116b to be connected with the semiconductor chip 13. The first pads 116a are arranged so that the passive elements 12 have a longitudinal direction perpendicular to a filling direction of the encapsulation resin. If the filling direction of the encapsulation resin is parallel to a vertical direction of FIG. 2, the first pads 116a are arranged to have the longitudinal direction parallel to a horizontal direction of FIG. 2.

Referring to FIGS. 3A-3D and FIGS. 4-7, the description is made about the manufacturing method of the semiconductor device 10 using the mother wiring board 20 in order of process.

Figure 3A:
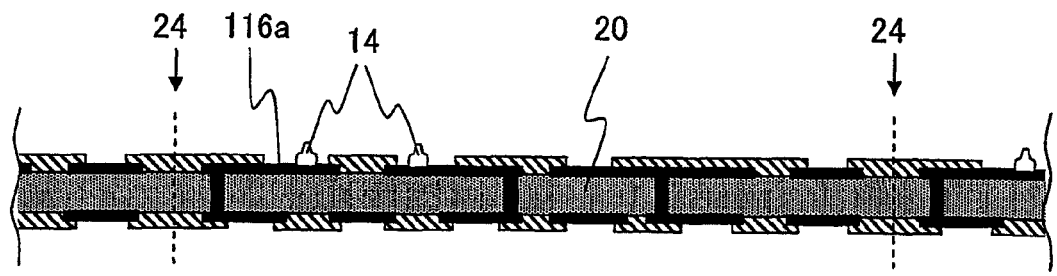
FIGS. 3A to 3D are longitudinal sectional views for describing manufacturing process for manufacturing the semiconductor device of FIG. 1 using the mother wiring board of FIG. 2.

First, as illustrated in FIG. 3A, the wire bumps 14 are provided on the first pads 116a respectively. The wire bumps 14 may be formed by means of a wire bonding machine (not shown). Specifically, each of the wire bumps 14 is formed using a wire of Au, Cu or the like. The tip of the wire is molten to form a ball. The ball is bonded to the first pad 116a by ultrasonic thermo compression bonding. After that, the rear of the wire is plucked to leave the ball and thereby forming the wire bump 14. The tip of the plucked ball may be flatten to obtain the wire bump 14. The height of the wire bump 14 may be adjusted by selecting a diameter of the wire and/or adjusting a diameter of the ball.

Figure 3B:
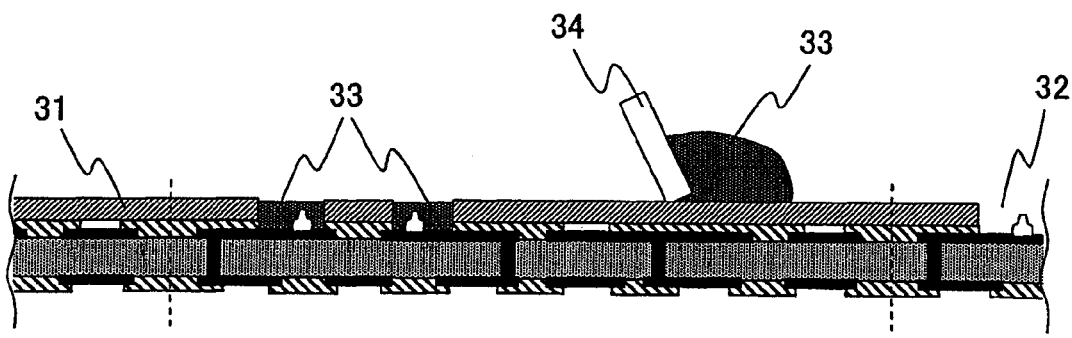

Next, as illustrated in FIG. 3B, a printing mask 31 is arranged on one surface of the wiring mother board 20. The printing mask 31 has openings at positions corresponding to the first pads 116a. Through the openings of the printing mask 31, solder paste 33 is supplied on the first pads 116a. The supply of the solder paste 33 may be executed by means of a squeegee 34. After that, the printing mask 31 is removed. By this manner, the solder paste is arranged on the first pads 116a selectively.

Figure 3C:
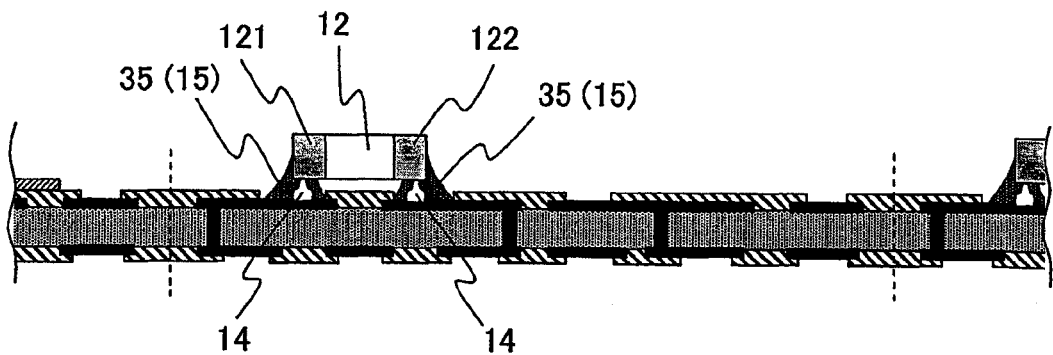

The passive elements 12 are mounted on the mother wiring board 20 so that the electrodes 121 and 122 of the passive elements 12 are positioned on the solder paste 33. Then, the solder paste 33 is heated to a predetermined temperature and molten in the reflow process. The molten solder paste forms fillets 35 (to be solder 15) as illustrated in FIG. 3C. In the state where the solder paste is molten, there is possibility that the passive elements 12 move toward the lower side of FIG. 3C (or toward the mother wiring board 20) due to gravitation. The wire bumps 14 support the passive elements 12, which are apt to move downward, from the side of the mother wiring board 20 to maintain the distance between the passive elements 12 and the mother wiring body 20 at the predetermined distance or more. Thus, the spaces for being filled with the encapsulation resin are secured between the passive elements 12 and the mother wiring board 20. When the solder 15 congeals, the passive elements 12 are supported by the wire bumps 14 and solder 15. The electrodes 121 and 122 are electrically coupled to the corresponding first pads 116a respectively with the solder 15 and wire bumps 14.

Then, flux cleaning is executed to remove the residual of the flux. Because the spaces are secured between the passive elements 12 and the mother wiring board 20, the result of the flux cleaning is good.

Figure 3D:
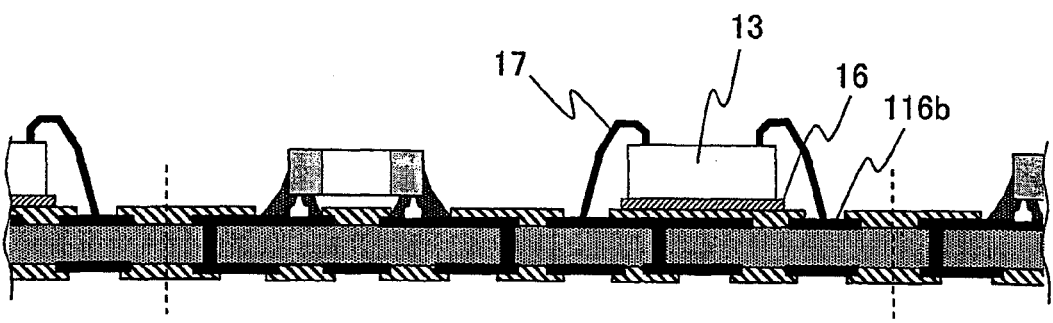

Next, as illustrated in FIG. 3D, the semiconductor chips 13 are attached and fixed on the mother wiring board 20 at predetermined positions by the adhesive 16. The electrode pads of the semiconductor chips 13 are electrically coupled to the corresponding second pads 116b of the mother wiring board 20 with the bonding wires 17, respectively.

Figure 4:
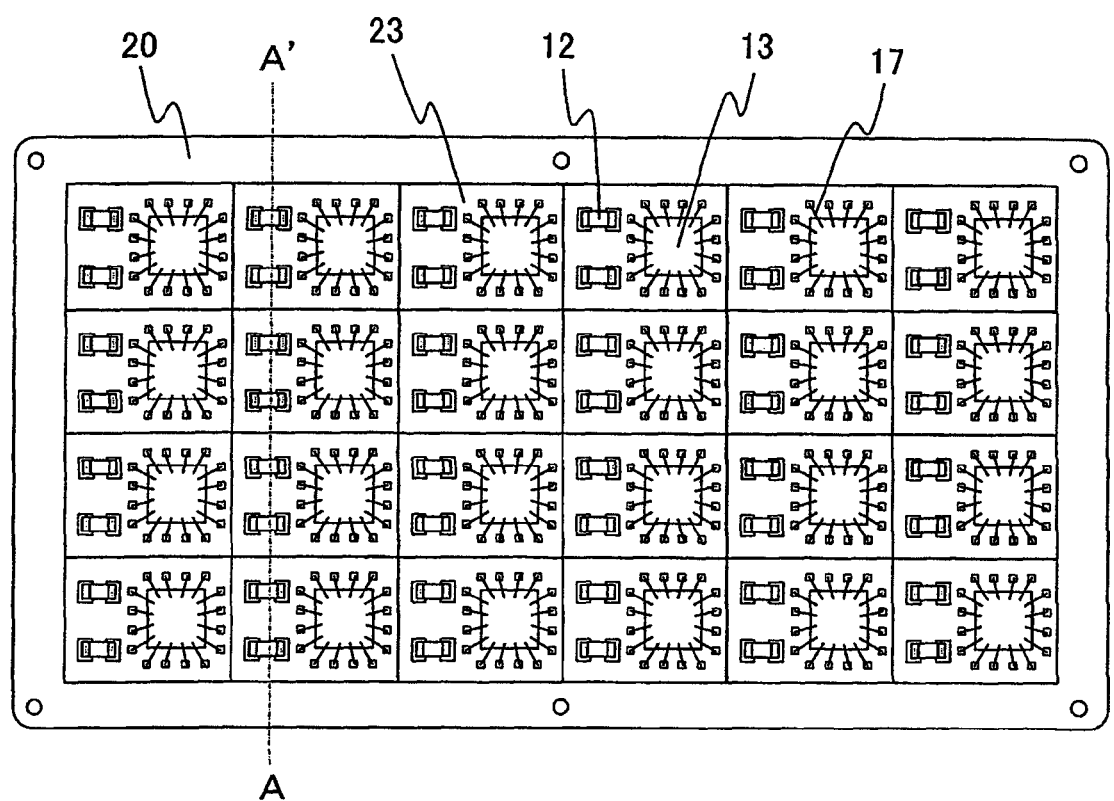
FIG. 4 is a plan view of the mother wiring board after finishing the process shown in FIG. 3D.

FIG. 4 is a plan view of the mother wiring board 20 in a state where a wire bonding process is finished. On each of the product formation portions 23, two of the passive elements 12 and one of the semiconductor chips 13 are mounted. The passive elements 12 is arranged to have the longitudinal direction (or the horizontal direction of FIG. 4) perpendicular to the filling direction (or the vertical direction of FIG. 4) of the encapsulation resin. Incidentally, the longitudinal direction of the passive elements 12 are not necessarily perpendicular to the filling direction of the encapsulating resin. However, It is necessary that they intersects with each other. The longitudinal direction of the passive elements 12 may be arranged according to design of the product.

After that, the encapsulation body 18 is formed on the surface of the mother wiring board 20 by means of collective molding. Hereafter, referring to FIGS. 5A-5C, the description will be made about the collective molding of the encapsulation body 18. Here, FIGS. 5A-5C correspond to longitudinal sections taken along an A-A' line of FIG. 4.

Figure 5A:
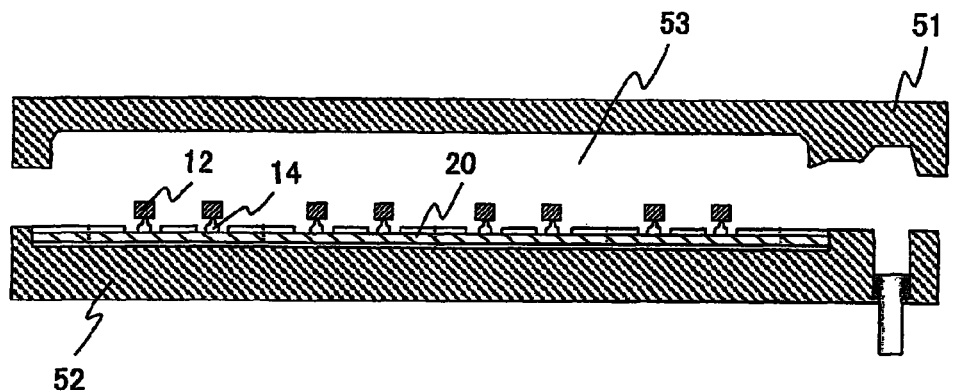
FIGS. 5A to 5C are longitudinal sectional views for describing encapsulating process for the mother wiring board shown in FIG. 4 using molding apparatus.

A transfer molding apparatus may be used as a molding apparatus to form the encapsulation body 18. As illustrated in FIG. 5A, the transfer molding apparatus includes an upper die 51 and a lower die 52 which define a cavity 53. When the upper die 51 and the lower die 52 are opened, the mother wiring board 20 obtained by finishing the wire connection process using the bonding wires 17 is put in the cavity 53.

Figure 5B:
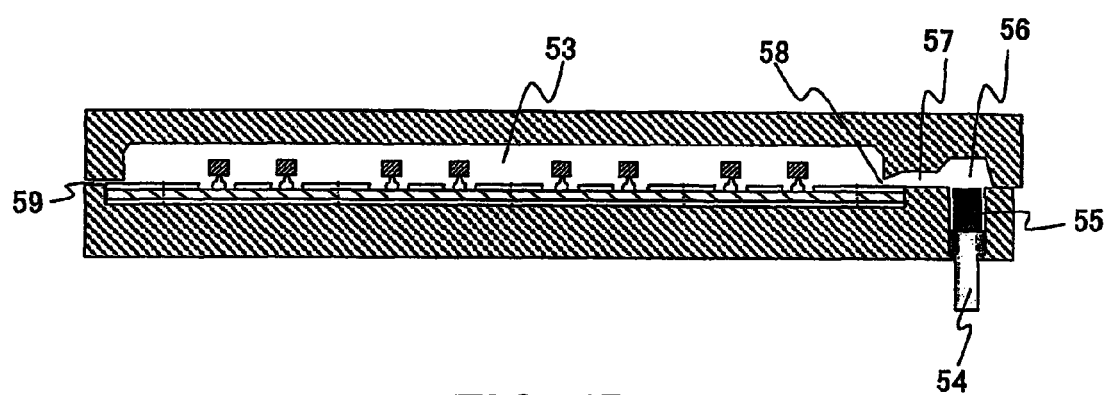

Next, as illustrated in FIG. 5B, raw material tablets 55 (only one shown), e.g. made of epoxy resin or the like, are set on plungers 54 (only one show). Then the upper die 51 and the lower die 52 are closed and clamped. After clamping the upper die 51 and the lower die 52, there are spaces, such as culls 56, runners 57, gates 58 and air vents 59 and so on between the upper die 51 and the lower die 52.

Figure 5C:
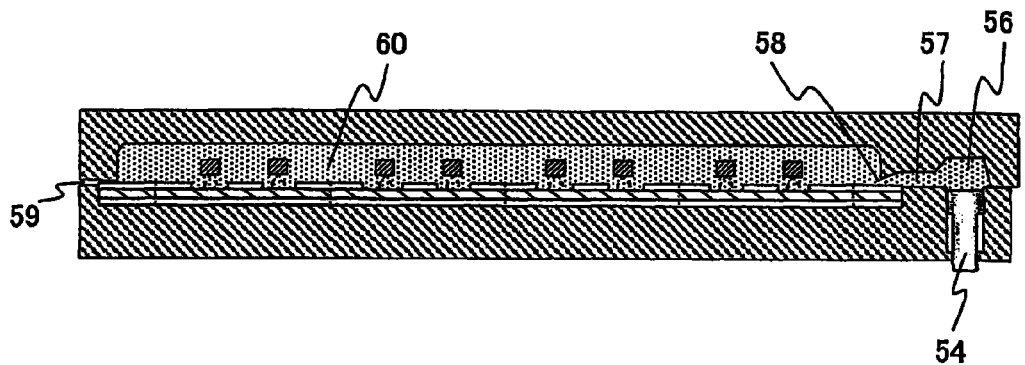

Next, as illustrated in FIG. 5C, the raw material tablets 55 are pressurized and molten by means of the plungers 54 and molten resin 60 is pressed into the cavity 53 through the culls 56, the runners 57 and the gates 58. The molten resin 60 flows from the gates 58 toward the air vents 59, or from the right side of FIG. 5C toward the left side thereof, in the cavity 53.

In the cavity 53, the molten resin 60 flows straight on the whole. Because the passive elements 12 are arranged to have the longitudinal direction perpendicular to the sheet surface of FIG. 5C, the space between each of the passive elements 12 and the mother wiring board 20 is opened to face the right and the left sides of FIG. 5C. Accordingly, the molten resin 60 flowing in the cavity 53 goes into the space between the passive element 12 and the mother wiring board 20 from the front of the space. Moreover, the distance between the passive element 12 and the mother wiring board 20 is maintained by the wire bumps 14 at the predetermined distance or more, as mentioned above. Thus, the molten resin 60 can enter the space between the passive element 12 and the mother wiring board 20 easily, and thereby preventing or suppressing occurrence of the voids.

Figure 6:
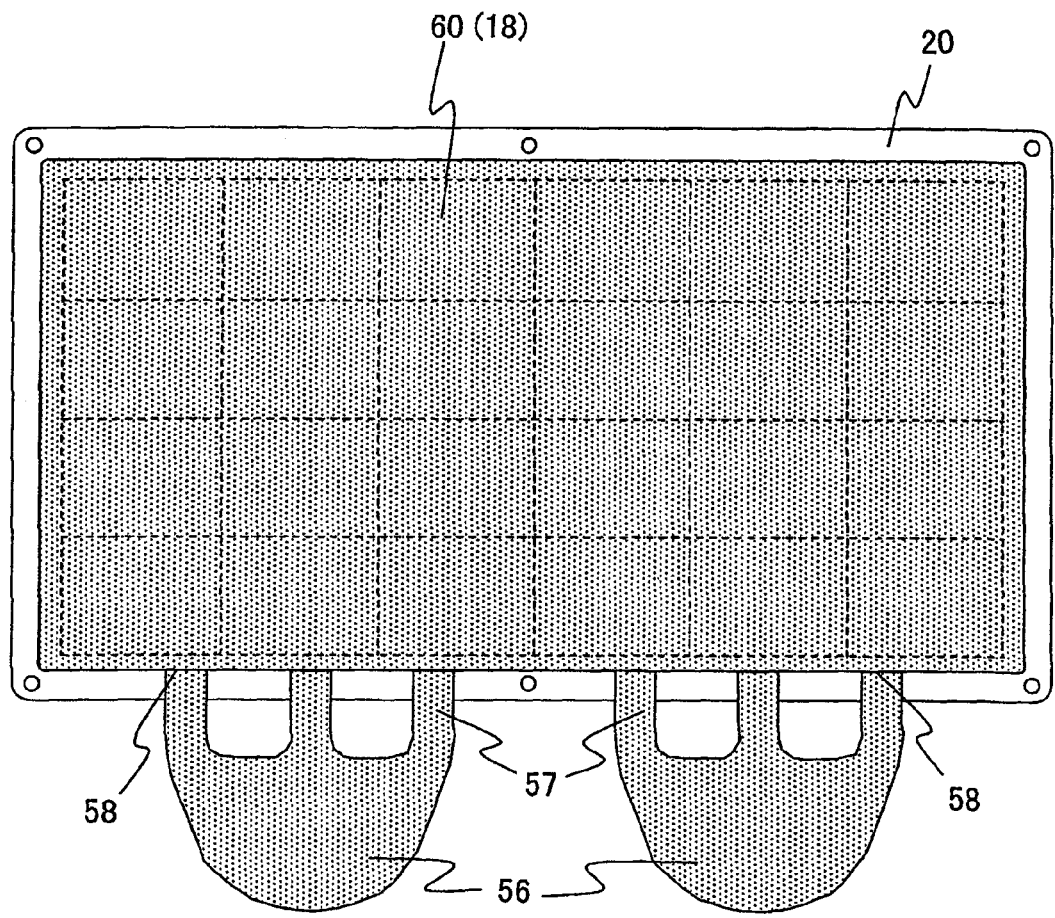
FIG. 6 is a plan view of the mother wiring board after finishing the encapsulating process.

FIG. 6 is a plan view of the mother wiring board 20 after finishing the encapsulation. The molten resin 60 (i.e. the encapsulation resin) is filled from the lower side of FIG. 6 toward the upper side thereof. That is, the molten resin 60 enters the cavity 53 through the runners 57 and gates 58 from the culls 56 and flows straight in the cavity 53 from the lower side of FIG. 6 toward the upper side thereof.

Figure 7A:
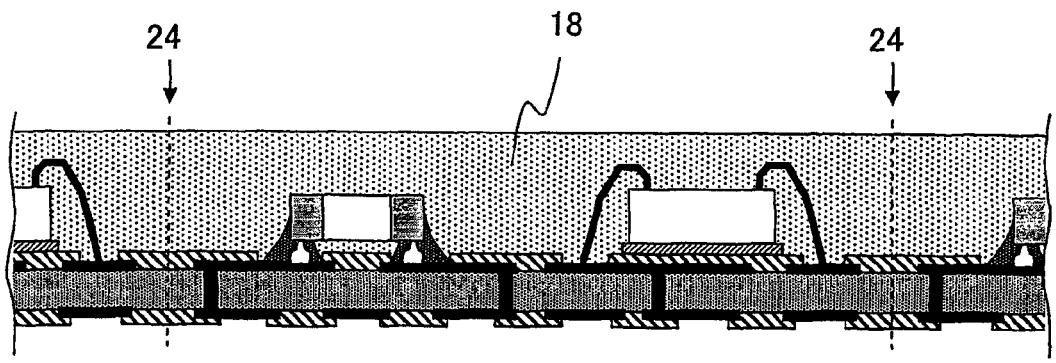
FIG. 7A is a partial longitudinal sectional view of an intermediate product after finishing the encapsulating process.

FIG. 7A is a partial longitudinal sectional view of the mother wiring board 20 after finishing the encapsulation. The molten resin 60 congeals and changes into the encapsulation body 18. The encapsulation body 18 is filled in the space between the passive element 12 and the mother wiring board 20 with no void.

Figure 7B:
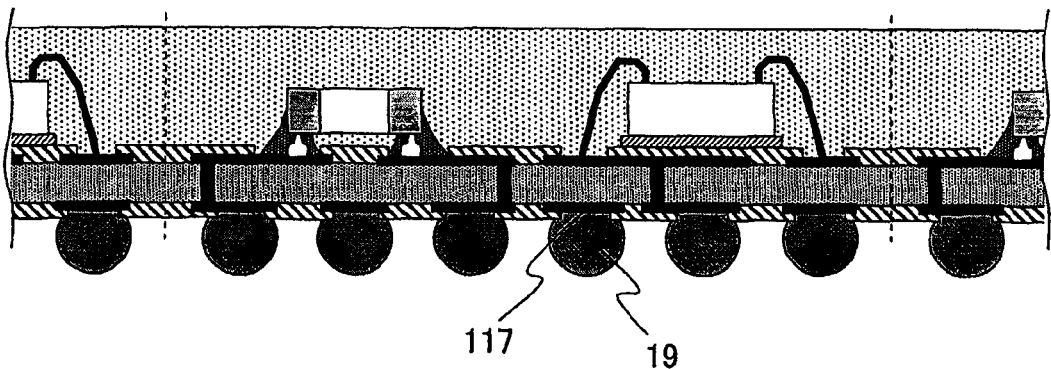
FIG. 7B is a partial longitudinal sectional view for describing mounting solder balls onto the mother wiring board of the intermediate product of FIG. 7A.

Next, as illustrated in FIG. 7B, the solder balls 19 are mounted on the lands 117 of the second surface of the mother wiring board 20. Mounting the solder balls 19 may be executed by means of an absorption mechanism (not shown) which has a plurality of absorption holes arranged to correspond to the lands 117. In such a case, the solder balls 19 are absorbed and held by the absorption mechanism. To the solder balls 19 held by the absorption mechanism, flux is transferred. Then, the solder balls 19 are collectively mounted on the lands 117 of the mother wiring board 20. After that, the reflow process is executed to connect and fix the solder balls 19 to the lands 117.

If any voids are in the encapsulation body 18, there is a possibility that reflow heating for mounting the solder balls 19 causes cracks due to the voids. According to the first embodiment, it is possible to prevent or suppress the occurrence of cracks because occurrence of the voids is prevented or suppressed as mentioned above. Therefore, it is possible to manufacture efficiently the semiconductor device including a semiconductor chip and a passive element(s) and having high reliability.

Figure 7C:
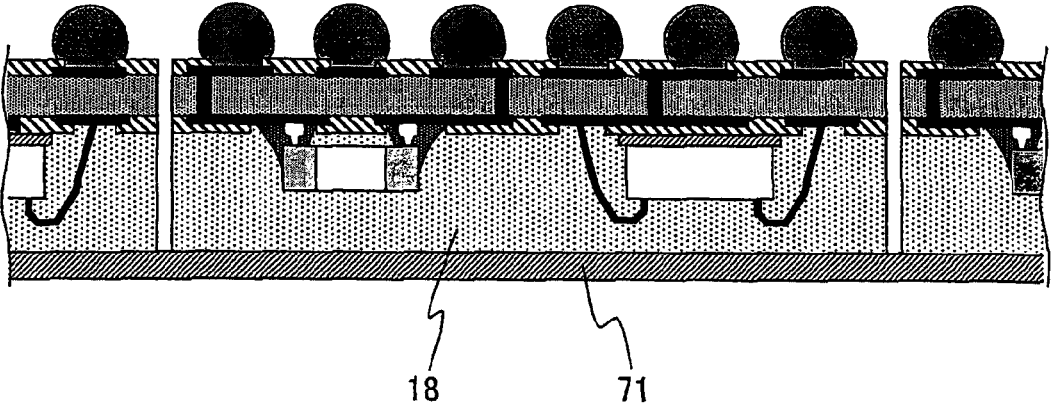
FIG. 7C is a partial longitudinal sectional view for describing dicing the intermediate product of FIG. 7B.

Next, as illustrated in FIG. 7C, on a surface of the encapsulation body 18, a dicing tape 71 is attached. The encapsulation body 18 is fixed to a dicing machine (not shown) together with the mother wiring board 20. Then the mother wiring board 20 and the encapsulation body 18 are cut vertically and horizontally along the dicing lines 24 by a dicing blade (not shown). As a result, the mother wiring board 20 is divided into each piece corresponding the product formation portion 23. After that, the piece of the product formation portion 23 with the encapsulation body 18 are picked up from the dicing tape 71 and thereby obtaining the semiconductor device 10.

Figure 8:
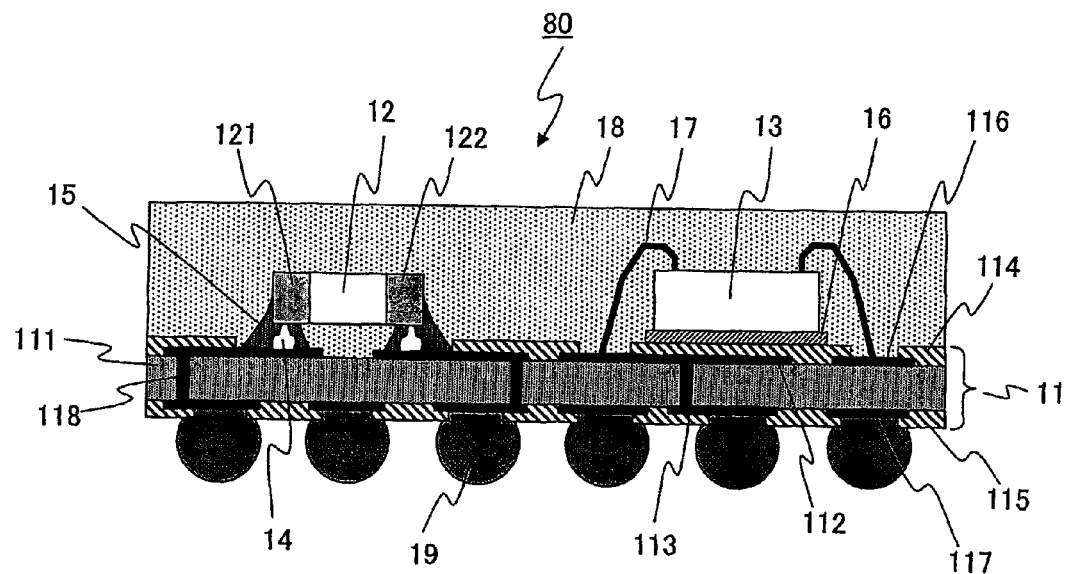
FIG. 8 is a longitudinal sectional view illustrating a schematic configuration of a semiconductor device according to a second embodiment of this invention.

Next, referring to FIG. 8, the description will be directed to a semiconductor device according to a second embodiment of this invention.

The semiconductor device 80 of FIG. 8 includes a first protective layer 114 which are different from that of the semiconductor device 10 of FIG. 1 in its formation areas. The semiconductor device 80 is similar to the semiconductor device 10 except for the above mentioned point. Accordingly, the description will be omitted about similar parts in the following.

The first protective layer 114 is formed on the first surface of the wiring board 11 except for predetermined areas. The predetermined areas includes an area facing to the passive element 12 in addition to the areas for the connection pads 116. It is desirable that the opening of the first protective layer 114 facing to the passive element 12 has a width (in a direction perpendicular to the sheet surface of FIG. 8) equal to that of the passive element 13 or more. When the width of the opening is narrower, it is difficult for the molten resin 60 to enter the opening. Accordingly, there is a possibility that the narrow width of the opening causes voids. To the contrary, when the width of the opening is wider, it is easy for the molten resin 60 to enter the opening and go out therefrom. Thus, voids are prevented from being generated.

According to the second embodiment, the distance between the passive element 12 and the wiring board 11 is large in comparison with that of the semiconductor device 10 of the first embodiment. Consequently, occurrence of voids is further prevented or suppressed. In addition, even if the height of the wire bumps 14 is smaller than that of the semiconductor device 10 of the first embodiment, the distance between the passive element 12 and the wiring board 11 can be equal to that of the first embodiment. Therefore, it is possible to reduce the thickness of the semiconductor device.

Next, referring to FIG. 9, the detailed description will be made about a semiconductor device according to a third embodiment.

Figure 9:
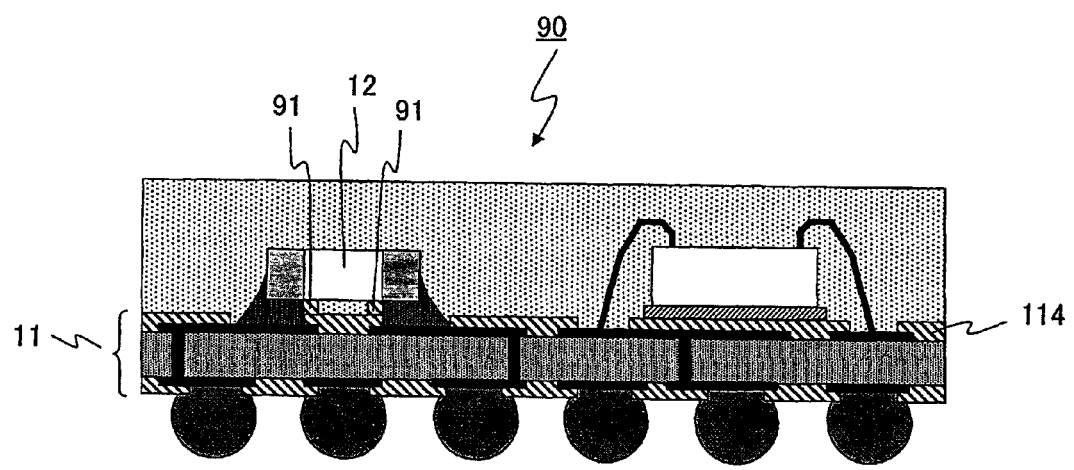
FIG. 9 is a longitudinal sectional view illustrating a schematic configuration of a semiconductor device according to a third embodiment of this invention.

The semiconductor device 90 of FIG. 9 is different from the semiconductor device 10 of FIG. 1 in a point that it has second protective layers 91 as the spacer members in place of the wire bumps 14. The semiconductor devices 90 are similar to the semiconductor device 10 except for the above mentioned point. Accordingly, the description will be omitted about similar parts in the following.

The second protective layers 91 are formed on the first protective layer to face parts of the passive element 12. The second protective layers 91 may be composed by the same material as the first protective layer 114. Alternatively, the second protective layers 91 may be different from the first protective layer 114 in material. At any rate, the second protective layers 91 only have to serve as the insulation support members. The second protective layers 91 may be formed along edges of the opening of the first protective layer 114 to widen the opening of the space formed between the passive element 12 and the wiring board 11 as large as possible. In such a case, the second protective layers 91 are adjacent to the solder 15 which is to be formed later.

According to the third embodiment, voids are prevented from being generated like the case of the semiconductor device 10 of the first embodiment. Because the semiconductor device 90 manufactured using the wiring board 11 on which the second protective layers 91 are previously formed as the spacer members, a step for securing the space between the passive element 12 and the wiring board 11 is unnecessary in an assembling process. In other words, it is possible to manufacture the semiconductor device having the predetermined distance or more between the passive element 12 and the wiring board 11 without addition of a new step to a related assembling process.

Figure 10:
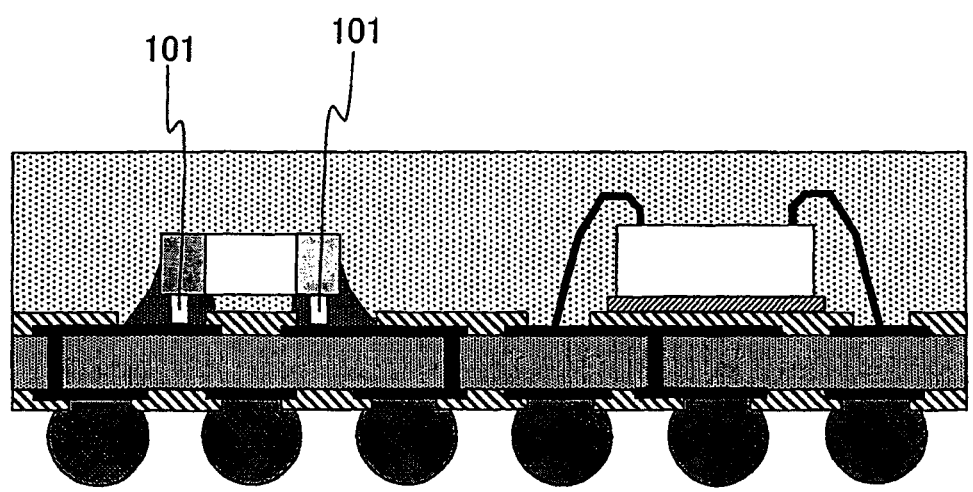
FIG. 10 is a longitudinal sectional view illustrating a schematic configuration of a semiconductor device according to another embodiment of this invention.

Although the invention has been described above in connection with several preferred embodiments thereof, it is apparent that the present invention is not limited to the above embodiments, but may be modified and changed without departing from the scope and spirit of the invention. For example, though the wire bumps 14 and the second protective layers 91 are illustrated as the spacer members in the embodiments mentioned above, insulation support members 101 may be provided on the connection pads 116 as illustrated in FIG. 10. The insulation support members 101 may be made of resin (e.g. epoxy), elastomer or the like. The insulation support members 101 may have an arbitrary form, such as a column shape or a dike shape.

Moreover, though the embodiments illustrate the semiconductor devices each of which has one semiconductor chip and two passive elements, the present invention is applicable to various semiconductor devices regardless of the number of components, such as semiconductor chips, passive elements and so on, included therein.

Furthermore, though the above mentioned embodiments illustrate the semiconductor devices of a ball grid array (BGA) type each of which has solder balls as the external terminals, the present invention is applicable to semiconductor devices of other types, such as a land grid array type having no solder ball or so.

Still furthermore, though the above mentioned embodiments illustrate the glassy epoxy substrate as the wiring board, another substrate, such as a flexible substrate including a polyimide base substance, a multilayer substrate or the like, is useable as the wiring board.

The whole or part of the exemplary embodiments disclosed above can be described as, but not limited to, the following supplementary notes.

(Supplementary Note 1) A method of manufacturing a device comprising:
providing a spacer member on a wiring board;
providing a solder member on the wiring board;
mounting an element on the wiring board by intervention of the spacer member to form a space between the element and the wiring board and to be electrically coupled to the wiring board via the solder member; and encapsulating the element with an encapsulation body on the wiring board to fill the space.

(Supplementary Note 2) A method according to Supplementary Note 1, further comprising dicing the wiring board after the encapsulating, wherein the wiring board comprises a plurality of product formation areas arranged on the wiring board, and the product formation areas are individually separated by the dicing.

(Supplementary Note 3) A method according to Supplementary Note 1, wherein the spacer member comprises a wire bump.

(Supplementary Note 4) A method according to Supplementary Note 3, wherein the solder member covers the wire bump.

(Supplementary Note 5) A method according to Supplementary Note 3, further comprising removing a part of a protective layer formed on the wiring board before the providing the spacer member, the part of the protective layer including an area facing to the element.

(Supplementary Note 6) A method according to Supplementary Note 1, wherein the spacer member comprises an insulation support member.

(Supplementary Note 7) A method according to Supplementary Note 6, wherein the solder member covers the insulation support member.

(Supplementary Note 8) A method according to Supplementary Note 16, wherein the solder member is adjacent to the insulation support member.

(Supplementary Note 9) A method according to 1, further comprising mounting a semiconductor chip on the wiring board before the encapsulating.

(Supplementary Note 10) A method according to Supplementary Note 1, further comprising mounting a solder ball on a surface of the wiring board that is different from a surface on which the element is mounted.

(Supplementary Note 11) A method according to Supplementary Note 1, wherein the element is distant from the wiring board by 20 μm or more.

(Supplementary Note 12) A method according to Supplementary Note 1, wherein the encapsulating is executed by transfer molding.

(Supplementary Note 13) A device according to Supplementary Note 12, wherein the element is located along a direction intersecting with a filling direction of the encapsulating body.

What is claimed is:

1. A device comprising:
   a wiring board comprising a core layer and a wiring layer formed on the core layer;
   a protective layer formed contacting the wiring layer and the core layer;
   an element mounted on the wiring board over a portion of the wiring layer and over a portion of the protective layer so that the element is in vertical registration over the portion of the wiring layer and over the portion of the protective layer;
   a pair of spacer members intervening between the portion of the wiring layer of the wiring board and the element to form a space therebetween and to support opposite ends of the element with the portion of the protective layer being located between the pair of spacer members; and
   an encapsulation body filling the space and encapsulating the element on the wiring board,
   wherein each of the pair of spacer members is located between a lower surface of the element and an upper surface of the portion of the protective layer.

2. A device according to claim 1,
   further comprising a solder member which electrically couples the element to the wiring board and covers the spacer member, and
   wherein the spacer member comprises a wire bump.

3. A device according to claim 1,
   further comprising a solder member which electrically couples the element to the wiring board and covers, at least partially, the spacer member, and
   wherein the spacer member comprises an insulation support member.

4. A device according to claim 1, further comprising a solder member which electrically couples the element to the wiring board and completely covers the spacer member, and
   wherein the spacer member comprises an insulation support member.

5. A device according to claim 1, further comprising a semiconductor chip mounted on the wiring board and encapsulated with the encapsulating body.

6. A device according to claim 1, wherein the element is distant from the wiring board by 20 μm or more.

7. A device according to claim 1, wherein the element comprises a passive element.

8. A device according to claim 1, wherein the element is located along a direction intersecting with a filling direction of the encapsulating body.

9. A semiconductor device comprising:
   a wiring board including an upper surface and a plurality of connection pads formed on the upper surface;
   a passive element mounted over the upper surface of the wiring board via a pair of insulation spacer members supporting opposite ends of the passive element to form a space between the wiring board and the passive element and between the pair of insulation spacer members, and that is electrically connected to at least an associated one of the connection pads;
   a semiconductor chip mounted over the upper surface of the wiring board, that is electrically connected to the associated one of the connection pads;
   an encapsulating body formed on the upper surface of the wiring board to cover the passive element and the semiconductor chip, the space being filled with the encapsulating body; and
   a solder member at each of the opposite ends of the passive element, such that each solder member electrically connects the passive element to the connection pads of the wiring board and completely covers the insulation spacer member.

10. The semiconductor device according to claim 9, further comprising a protective layer formed on the connection pads and on the upper surface of the wiring board, and
    wherein the passive element and the semiconductor chip are in vertical registration over portions of the protective layer.

11. The semiconductor device according to claim 9, further comprising a protective layer formed on the connection pads and on the upper surface of the wiring board, and
    wherein each insulation spacer member is located between a lower surface of the passive element and an upper surface of the protective layer.

12. The semiconductor device according to claim 9, wherein the wiring board comprises a protective layer formed in vertical registration below the passive element and each of the pair of insulation spacer members is located between a lower surface of the passive element and an upper surface of the protective layer.

13. The semiconductor device according to claim 9, wherein the passive element is distant from the wiring board by 20 μm or more.

14. A semiconductor device comprising:
a wiring board including an upper surface and a plurality of connection pads formed on the upper surface;
a protective layer formed contacting the contact pads and the upper surface of the wiring board;
a first pair of insulation spacer members provided on the wiring board;
a second pair of insulation spacer members provided on the wiring board, the second pair of insulation spacer members being substantially parallel to the first pair of insulation spacer members;
a first passive element bridged between the first pair of insulation spacer members to form a first space between the wiring board and the first passive element, the first passive element being electrically connected to the connection pads of the wiring board;
a second passive element bridged between the second pair of insulation spacer members to form a second space between the wiring board and the second passive element, the second passive element being electrically connected to the connection pads of the wiring board, and being substantially parallel to the first passive element; and
an encapsulating body formed on the wiring board to cover the first passive element, the second passive element, the first pair of insulation spacer members and the second pair of insulation spacer members, the first space and the second space being filled with the encapsulating body,
wherein, each of the first and second passive elements is in vertical registration over respective portions of the protective layer.

15. The semiconductor device according to claim 14, further comprising a semiconductor chip mounted over the upper surface of the wiring board and electrically connected to the plurality of connection pads, the semiconductor chip being covered with the encapsulating body.

16. The semiconductor device according to claim 14,
further comprising solder members which electrically couple each of the first and second passive elements to respective connection pads, each solder member at least partly covering a corresponding one of the insulation spacer members.

17. The semiconductor device according to claim 16,
wherein each of the insulation spacer members are located between a lower surface of a corresponding one of the first and second passive elements and an upper surface of a corresponding one of the portions of the protective layer.

* * * * *